United States Patent
Kosugi et al.

(10) Patent No.: US 11,777,324 B2
(45) Date of Patent: Oct. 3, 2023

(54) MONITORING SYSTEM, SERVER, TERMINAL DEVICE, MONITORING METHOD, AND PROGRAM

(71) Applicant: NEC Corporation, Tokyo (JP)

(72) Inventors: Shinichiro Kosugi, Tokyo (JP); Hiroshi Hanafusa, Tokyo (JP); Hideki Tanabe, Tokyo (JP); Yusuke Mori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 624 days.

(21) Appl. No.: 16/462,872

(22) PCT Filed: Jul. 26, 2017

(86) PCT No.: PCT/JP2017/026985
§ 371 (c)(1),
(2) Date: May 21, 2019

(87) PCT Pub. No.: WO2018/096727
PCT Pub. Date: May 31, 2018

(65) Prior Publication Data
US 2019/0324094 A1    Oct. 24, 2019

(30) Foreign Application Priority Data

Nov. 24, 2016  (JP) ................. 2016-227621

(51) Int. Cl.
*H02J 7/00* (2006.01)
*G01R 31/392* (2019.01)
(Continued)

(52) U.S. Cl.
CPC .......... *H02J 7/0029* (2013.01); *G01R 31/392* (2019.01); *H01M 10/48* (2013.01);
(Continued)

(58) Field of Classification Search
CPC ..... G01R 31/392; G01R 31/36; H01M 10/48; H02H 7/18; H02J 13/0013; H02J 13/00;
(Continued)

(56) References Cited

U.S. PATENT DOCUMENTS 4,929,901 A * 5/1990 Kimball ................. G01R 31/08
324/529
5,912,794 A   6/1999 Ichikawa
(Continued)

FOREIGN PATENT DOCUMENTS

EP    2760094 A1    7/2014
JP    H4-124836 U   11/1992
(Continued)

OTHER PUBLICATIONS

EP Office Action for EP Application No. 17873436.4 dated May 10, 2021.
(Continued)

*Primary Examiner* — Catherine T. Rastovski
*Assistant Examiner* — Lal C Mang

(57) ABSTRACT

This invention provides a monitoring system (10) including a detection unit (11) that detects that a detection value relating to a power storage system satisfies a condition; an identification unit (12) that identifies a type of fault occurring in the power storage system in accordance with the detection of the detection unit (11); and a decision unit (13) that decides an operation continuable time of the power storage system after the type of fault is identified, on the basis of the type of fault.

18 Claims, 12 Drawing Sheets

(51) Int. Cl.
  *H01M 10/48* (2006.01)
  *H02H 7/18* (2006.01)
  *H02J 13/00* (2006.01)

(52) U.S. Cl.
  CPC .............. *H02H 7/18* (2013.01); *H02J 7/0047* (2013.01); *H02J 13/00* (2013.01); *H02J 7/005* (2020.01); *H02J 7/0048* (2020.01); *H02J 7/00302* (2020.01); *H02J 7/00306* (2020.01); *H02J 7/00309* (2020.01)

(58) Field of Classification Search
  CPC .............. H02J 7/00302; H02J 7/00306; H02J 7/00309; H02J 7/0048; H02J 7/005; H02J 7/0029; H02J 7/0047; Y02E 60/10
  See application file for complete search history.

(56) References Cited

U.S. PATENT DOCUMENTS

| | | |
|---|---|---|
| 2009/0231150 A1 | 9/2009 | Feight |
| 2012/0013201 A1 | 1/2012 | Pariseau et al. |
| 2012/0169296 A1 | 7/2012 | Lukso et al. |
| 2013/0308239 A1* | 11/2013 | Yamada .................. H02H 3/02 361/93 |
| 2014/0042982 A1 | 2/2014 | Galamb et al. |
| 2014/0089692 A1* | 3/2014 | Hanafusa .................. G06F 1/28 713/310 |
| 2015/0263395 A1* | 9/2015 | Okabe ................. H01M 10/482 |

FOREIGN PATENT DOCUMENTS

| | | | | |
|---|---|---|---|---|
| JP | H9-238476 A | | 9/1997 | |
| JP | 2001249831 A | * | 9/2001 | .............. G06F 11/30 |
| JP | 2003-077503 A | | 3/2003 | |
| JP | 2003077503 A | * | 3/2003 | ............. Y02E 60/50 |
| JP | 2005185070 A | * | 7/2005 | ................ H02J 9/00 |
| JP | 2008-305164 A | | 12/2008 | |
| JP | 2008305164 A | * | 12/2008 | ............. Y02E 60/10 |
| JP | 2013-509669 A | | 3/2013 | |
| JP | 2016-082699 A | | 5/2016 | |
| JP | 2016-090416 A | | 5/2016 | |
| WO | WO-2011/030254 A1 | | 3/2011 | |
| WO | WO-2013/042517 A1 | | 3/2013 | |
| WO | WO-2013/140781 A1 | | 9/2013 | |

OTHER PUBLICATIONS

Extended European Search Report issued in European Patent Application No. 17873436.4, dated Sep. 23, 2019, 8 pages.
International Search Report corresponding to PCT/JP2017/026985, dated Oct. 10, 2017, 2 pages.

* cited by examiner

FIG. 6

| TYPE OF DEFECT | OPERATION CONTINUABLE TIME |
|---|---|
| ⋮ | ⋮ |

FIG. 12

| TYPE OF PROHIBITED ACTION | OPERATION CONTINUABLE TIME |
|---|---|
| ⋮ | ⋮ |

MONITORING SYSTEM, SERVER, TERMINAL DEVICE, MONITORING METHOD, AND PROGRAM

CROSS-REFERENCE TO RELATED APPLICATIONS

This application is a national stage application of International Application No. PCT/JP2017/026985 entitled "MONITORING SYSTEM, SERVER, TERMINAL DEVICE, MONITORING METHOD, AND PROGRAM," filed on Jul. 26, 2017, which claims the benefit of the priority of Japanese Patent Application No. 2016-227621 filed on Nov. 24, 2016, the disclosures of each of which are hereby incorporated by reference in their entirety.

TECHNICAL FIELD

The present invention relates to a monitoring system, a server, a terminal device, a monitoring method, and a program.

BACKGROUND ART

Patent Document 1 discloses a storage battery state monitoring system that monitors the state of each storage battery, with respect to equipment including a battery pack in which a plurality of storage batteries are connected in series. The storage battery state monitoring system includes a current detection unit that detects a current in each storage battery, and a state measuring unit that measures an operating time, a temperature, a voltage and an internal resistance at two or more kinds of frequencies of each storage battery. The storage battery state monitoring system distinguishes a state where each storage battery system is not normal between an initial failure or an accidental failure from a deterioration over time, based on at least one or more values among the temperature, the voltage, and the internal resistance measured by the state measuring unit, and a DC resistance of each storage battery obtained from a ratio between the change of the value of the current detected by the current detection unit at the time of discharge of each storage battery and the change of the value of the voltage measured by the state measuring unit.

Patent Document 2 discloses a system that takes measures to stop the use in a case where abnormality of a storage battery is found in abnormality tests.

RELATED DOCUMENT

Patent Document

[Patent Document 1] Japanese Laid-open Patent Publication No. 2016-90416
[Patent Document 2] Pamphlet of International Publication No. WO2013/140781

SUMMARY OF THE INVENTION

Technical Problem

The types of faults of the power storage system are various from a serious fault that is likely to cause serious troubles such as a fire to a minor fault that is unlikely to cause serious troubles. Considering safety, it is preferable to stop the operation of the power storage system when a fault occurs. However, in consideration of the benefit of the user of the power storage system, it is not preferable to stop the operation of the power storage system indiscriminately regardless of the details of the fault.

An object of the present invention is to provide a technique of enhancing utilization efficiency of a power storage system while ensuring safety.

Solution to Problem

According to the present invention, there is provided a monitoring system including
a detection unit that detects that a detection value relating to a power storage system satisfies a condition;
an identification unit that identifies a type of fault occurring in the power storage system, in accordance with the detection by the detection unit; and
a decision unit that decides an operation continuable time of the power storage system after the type of fault is identified, on the basis of the type of fault.

According to the present invention, there is provided a monitoring system including
a terminal device; and
a server,
in which the terminal device includes the detection unit,
in which the terminal device or the server includes the identification unit, and
in which the server includes the decision unit.

According to the present invention, there is provided the server.

According to the present invention, there is provided the terminal device.

According to the present invention, there is provided a monitoring method executed by a computer, the method including
a detection step of detecting that a detection value relating to a power storage system satisfies a condition;
an identification step of identifying a type of fault occurring in the power storage system, in accordance with the detection in the detection step; and
a decision step of deciding an operation continuable time of the power storage system after the type of fault is identified, on the basis of the type of fault.

According to the present invention, there is provided a program causing a computer to function as:
a detection unit that detects that a detection value relating to a power storage system satisfies a condition;
an identification unit that identifies a type of fault occurring in the power storage system, in accordance with the detection by the detection unit; and
a decision unit that decides an operation continuable time of the power storage system after the type of fault is identified, on the basis of the type of fault.

Advantageous Effects of Invention

The present invention allows enhancement in utilization efficiency of a power storage system while ensuring safety.

BRIEF DESCRIPTION OF THE DRAWINGS

The foregoing and other objects, features and advantages will become more apparent from the following description of preferred example embodiments and the accompanying drawings.

FIG. 6 is a diagram schematically showing an example of information handled by the monitoring system of the present example embodiment.

FIG. 12 is a diagram schematically showing an example of information handled by the monitoring system of the present example embodiment.

DESCRIPTION OF EMBODIMENTS

First Example Embodiment

First, the outline of the present example embodiment will be described. In a monitoring system of the present example embodiment, in a case where a minor fault occurs in a power storage system, a subsequent operation continuable time is decided according to the type of the fault that has occurred. In such a case, the power storage system can continue to operate as it is even after occurrence of the fault. Then, when an operation continuing time exceeds the operation continuable time, the monitoring system can stop the operation of the power storage system.

It should be noted that, in a case a serious fault occurs, the operation of the power storage system can be stopped immediately. In other words, only in a case where a minor fault occurs, it is possible to decide the operation continuable time and operate as it is.

As described above, according to the monitoring system of the present example embodiment, instead of stopping the operation of the power storage system indiscriminately when a fault occurs, it is possible to perform a process of immediately stopping the operation or stopping after operating as it is for a certain period of time (operation continuable time), according to the type of the fault. By appropriately setting the operation continuable time, the operation of the power storage system can be stopped, before a serious secondary fault caused by a minor fault occurs.

The monitoring system of the present example embodiment allows enhancement in utilization efficiency of a power storage system while ensuring safety.

It should be noted that, "fault" may be a concept including "failure". In other words, fault may be a concept including failure and other faults. Alternatively, "fault" may be synonymous with "failure". In other words, fault may mean failure.

Next, an example of the hardware configuration of the monitoring system of the present example embodiment will be described. Each functional unit included in the monitoring system of the present example embodiment is implemented by any combination of hardware and software of any computer, mainly using a central processing unit (CPU), a memory, a program to be loaded into the memory, and a storage unit such as a hard disk storing the program (can store programs stored in advance in the stage of shipping the apparatus, and also store programs downloaded from a storage medium such as a compact disc (CD) or a server on the Internet), and a network connection interface. Those skilled in the art will understand that there are various modifications in the implementation methods and apparatuses.

Figure 1:
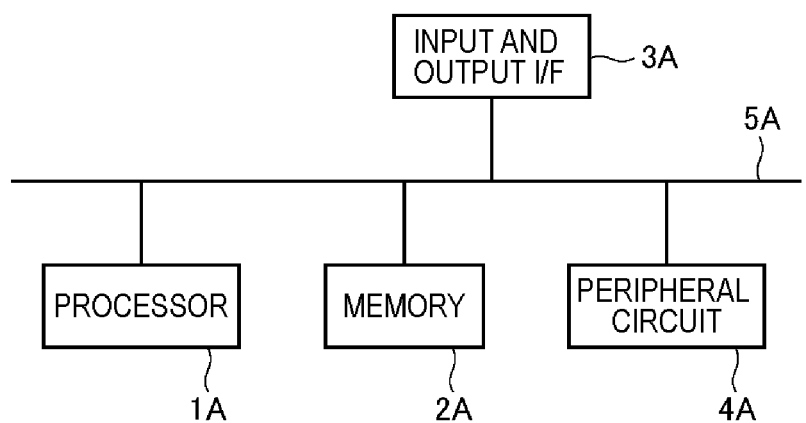
FIG. 1 is a diagram conceptually illustrating an example of a hardware configuration of an apparatus of a present example embodiment.

FIG. 1 is a block diagram illustrating a hardware configuration of the monitoring system of the present example embodiment. As shown in FIG. 1, the monitoring system includes a processor 1A, a memory 2A, an input and output interface 3A, a peripheral circuit 4A, and a bus 5A. The peripheral circuit 4A includes various modules. Note that, the peripheral circuit 4A may not be included.

It should be noted that, the monitoring system may be realized by a single apparatus or may be realized by a plurality of apparatuses separated physically and/or logically from each other. In the latter case, each of the plurality of apparatuses may have the hardware configuration as shown in FIG. 1. A plurality of apparatuses may cooperate to realize the functions of the monitoring system.

The bus 5A is a data transmission path through which the processor 1A, the memory 2A, the peripheral circuit 4A and the input and output interface 3A mutually transmit and receive data. The processor 1A is, for example, an arithmetic processing apparatus such as a central processing unit (CPU) or a graphics processing unit (GPU). The memory 2A is, for example, a memory such as a random access memory (RAM) or a read only memory (ROM). The input and output interface 3A includes an interface for acquiring information from an input device (for example, a keyboard, a mouse, and a microphone), an external apparatus, an external server, an external sensor, and the like, and an interface for outputting information to an output device (for example, a display, a speaker, a printer, and a mailer), an external apparatus, an external server, and the like. The processor 1A issues commands to the modules and can perform calculation based on the calculation results.

Figure 2:
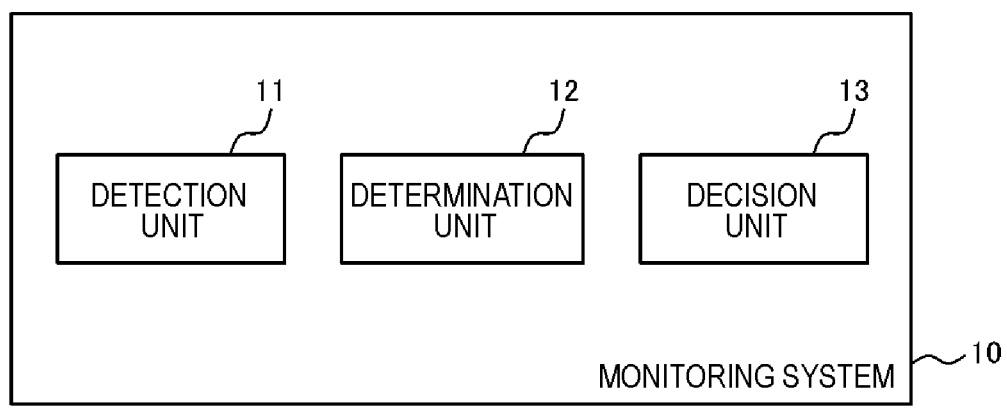
FIG. 2 is an example of a functional block diagram of a monitoring system of the present example embodiment.

Next, the functions of the monitoring system of the present example embodiment will be described in detail. FIG. 2 shows an example of a functional block diagram of the monitoring system 10 of the present example embodiment. As shown in FIG. 2, the monitoring system 10 includes a detection unit 11, an identification unit 12, and a decision unit 13.

Figure 3:
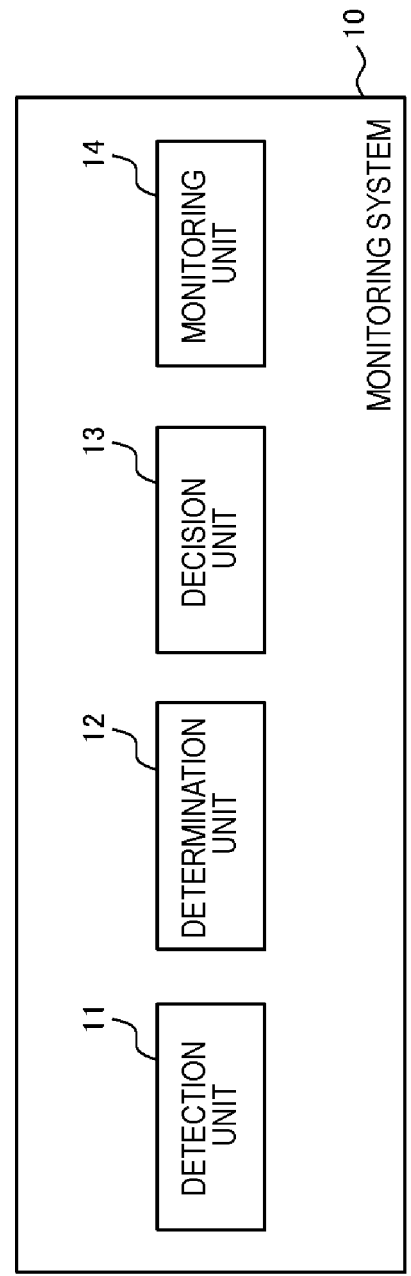
FIG. 3 is an example of the functional block diagram of the monitoring system of the present example embodiment.

FIG. 3 shows another example of the functional block diagram of the monitoring system 10 of the present example embodiment. As shown in FIG. 3, the monitoring system 10 may include a monitoring unit 14 in addition to the detection unit 11, the identification unit 12, and the decision unit 13.

It should be noted that, the functional block diagram shows blocks of functional units rather than the configuration of a hardware unit. It should be noted that, the same reference numerals may be attached to the same configuration components, and the description thereof will not be repeated as appropriate. Hereinafter, each functional unit will be described in detail.

The detection unit 11 detects that the detection value relating to the power storage system satisfies the condition. The detection value is a value for detecting a fault occurring in the power storage system. The detection unit 11 can acquire the detection value from a power storage system, a sensor attached to the power storage system, or the like.

The detection value may be, for example, the current value and the voltage value of the whole power storage system, the current value, the voltage value, and the insulation resistance value of each cell stack, the voltage value of each cell, the execution duration of the cell balance of each cell (the execution duration of the process of discharging until the cell voltage reaches a target value, the same applies hereinafter), the period of time (interval) between the cell balance and the next cell balance, the temperature, the predetermined-gas concentration, and the image of the power storage system, the output value of an open and close sensor that detects opening and closing of a door of the power storage system, the output value of a vibration sensor that detects vibration occurring in the power storage system, the output value of a submergence sensor attached to the power storage system at a predetermined position, the communication retry count during communication between the power storage system and the server, and the like. Note that, the illustration here is only an example, and the present invention is not limited thereto.

The conditions are divided into a first condition and a second condition. The first condition is a condition for detecting a minor fault. The second condition is a condition for detecting a serious fault. Note that, whether to classify each fault that may occur in the power storage system into a serious fault or a minor fault is a design matter. Each condition can be defined with one or more of a plurality of detection values in combination as described above.

For example, the second condition may be "the concentration of a predetermined gas is equal to or higher than a predetermined value". In this way, leakage of a predetermined gas from the power storage system can be detected as a serious fault. In addition, for example, "the temperature of the power storage system is equal to or higher than a predetermined value" may be set as the second condition. Accordingly, it is possible to detect a temperature rise equal to or higher than a predetermined value of the power storage system as a serious fault. Note that, the second condition illustrated is only an example, and the second condition is not limited thereto.

Further, for example, "the insulation resistance value of the cell stack is less than or equal to a predetermined value" may be set as the first condition. Accordingly, it is possible to detect abnormal insulation resistance of the cell stack as a minor fault. In addition, for example, "the communication retry count is not less than a predetermined number of times within a predetermined period of time" may be set as the first condition. In this way, it is possible to detect a communication failure of the power storage system as a minor fault.

In a case of detecting that the detection value satisfies the first condition, the detection unit 11 notifies the identification unit 12 of the fact. On the other hand, in a case of detecting that the detection value satisfies the second condition, the detection unit 11 outputs a stop command for stopping the operation of the power storage system. In accordance with the stop command, the power storage system stops the operation (for example, charging and discharging) of its own system.

Figure 4:
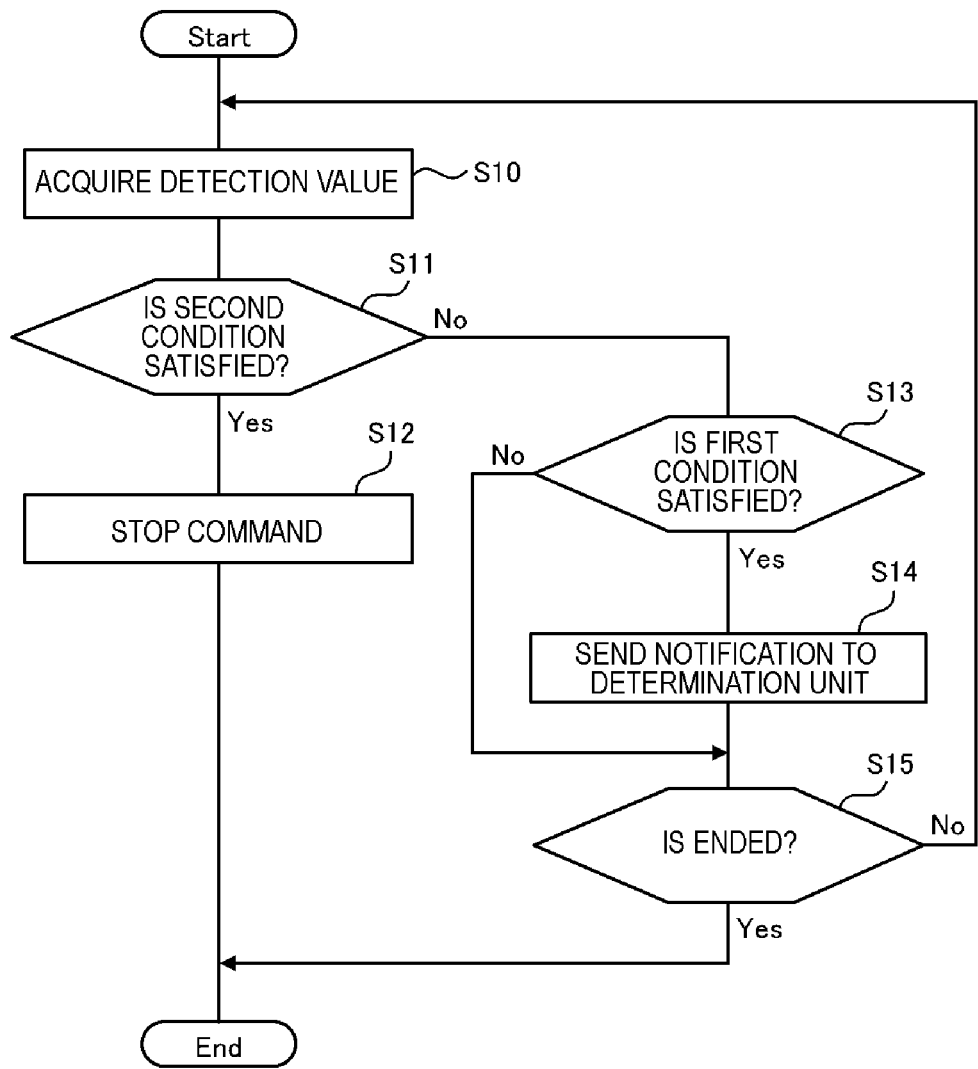
FIG. 4 is a flowchart showing an example of a process flow of the monitoring system of the present example embodiment.

Here, an example of a process flow of the detection unit 11 will be described with reference to the flowchart of FIG. 4.

In S10, the detection unit 11 acquires a detection value. For example, one or plural types of detection values measured at predetermined time intervals are acquired by the detection unit 11 each time measurement is performed. The plural types of detection values may be measured at the same timing or at different timings. When acquiring the detection value, the detection unit 11 determines whether or not a predetermined condition is satisfied according to the detection value.

In a case where the second condition is satisfied (Yes in S11), the detection unit 11 outputs a stop command for stopping the operation of the power storage system (S12). Then, the detection unit 11 ends the processing. For example, in a case where the detection value satisfies the second condition indicating the gas leakage from the power storage system, the detection unit 11 outputs a stop command for stopping the operation of the power storage system. In accordance with the stop command, the power storage system stops the operation (for example, charging and discharging) of its own system.

On the other hand, in a case where the second condition is not satisfied (No in S11) but the first condition is satisfied (Yes in S13), the detection unit 11 notifies the identification unit 12 of the fact (S14). In a case where there is no signal to end the process (No in S15), the above process is repeated. For example, in a case where the first condition such as "the insulation resistance value of the cell stack is less than or equal to a predetermined value" or "the communication retry count is not less than a predetermined number of times within a predetermined period of time", the detection unit 11 notifies the identification unit 12 of the fact.

In a case where the second condition is not satisfied (No in S11) and the first condition is not satisfied (No in S13), if there is no signal for terminating the process (No in S15), the detection unit 11 repeats the above process.

Returning to FIGS. 2 and 3, the identification unit 12 identifies the type of fault occurring in the power storage system, in accordance with the detection by the detection unit 11. Note that, the identification unit 12 identifies the type of fault occurring in the power storage system, in accordance with the detection that the first condition is satisfied. In the case where it is detected that the second condition is satisfied, the identification unit 12 may not identify the type of fault occurring in the power storage system. The identification unit 12 can identify, for example, N ground faults (N is an integer of 1 or more), communication failure, and the like, as types of faults.

It should be noted that, the identification unit 12 may acquire information indicating that the detection unit 11 detects which first condition is satisfied, from the detection unit 11. Then, based on the information, the identification unit 12 may identify the type of the fault. For example, in a case where the first condition "the communication retry count is not less than a predetermined number of times within a predetermined period of time" is satisfied, the detection unit 11 may notify the identification unit 12 of the information indicating the first condition. Then, based on the information indicating the first condition, the identification unit 12 may identify the type of the fault "communication failure".

In addition, the identification unit 12 may acquire information indicating that the detection unit 11 detects which first condition is satisfied, from the detection unit 11. The identification unit 12 may then acquire the detection value associated with the first condition and identify the type of the fault on the basis of the acquired detection value. For example, in a case where the first condition "the insulation resistance value of the cell stack is less than or equal to a predetermined value" is satisfied, the detection unit 11 may notify the identification unit 12 of the information indicating the first condition. The identification unit 12 may then acquire at least one of the voltage value of each of the plurality of cells included in the cell stack or the execution duration of the cell balance. Then, in a case where the cell voltage of at least one cell falls below the reference value or in a case where the execution duration of the cell balance of at least one cell exceeds the reference value, the identification unit 12 may identify the type of fault as "ground fault". Further, the identification unit 12 may determine "the number of cells whose cell voltage falls below the reference value" or "the number of cells in which the execution duration of the cell balance exceeds the reference value" as the occurrence number of the ground fault. This process will be described in detail in the following examples. In addition, the identification unit 12 may identify a cell whose time (interval) between the cell balance and the next cell balance is shorter than the reference value, as a cell in which a ground fault occurs.

It should be noted that, the identification unit 12 may start monitoring whether or not the detection value satisfies the stop condition in accordance with the detection by the detection unit 11 (detection that the first condition is satisfied). Then, when the detection value satisfies the stop condition, the identification unit 12 may output a stop command for stopping the operation of the power storage system. In accordance with the stop command, the power storage system stops the operation (for example, charging and discharging) of its own system.

The stop condition is, for example, a condition for detecting serious fault that may occur in a case where the first condition is satisfied. For example, in a case where the first condition is "the insulation resistance value of the cell stack is less than or equal to the predetermined value", the stop condition may be "occurrence of two or more ground faults". Note that, the stop conditions illustrated here are only examples, and the present invention is not limited thereto.

Figure 5:
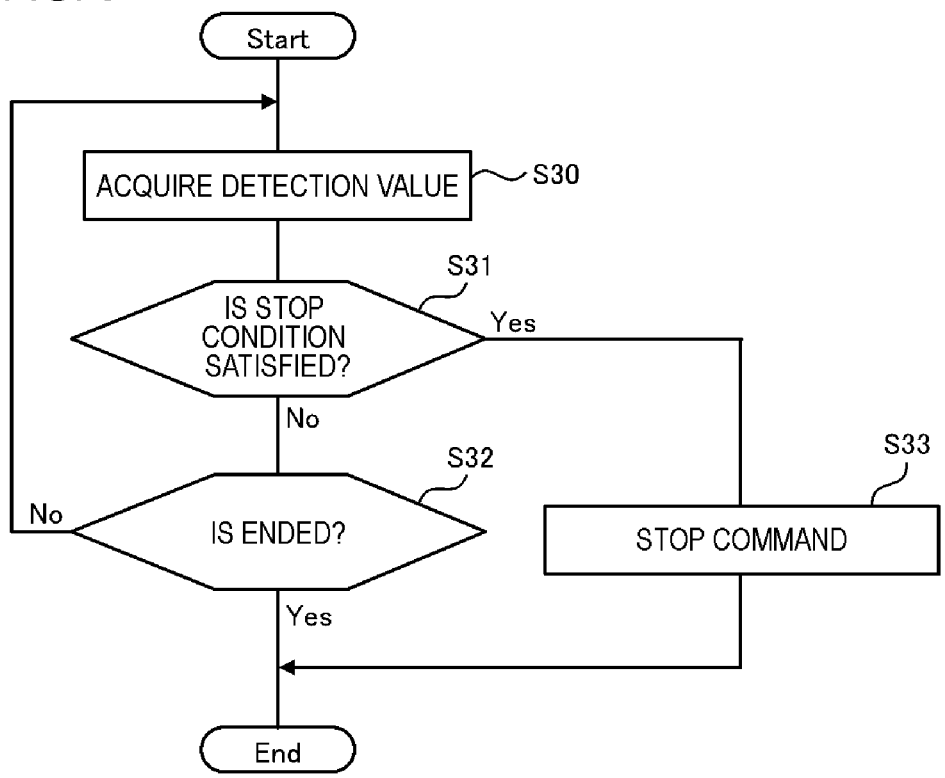
FIG. 5 is a flowchart showing an example of a process flow of the monitoring system of the present example embodiment.

Here, an example of the flow of the monitoring process by the identification unit 12 will be described with reference to the flowchart of FIG. 5.

When acquiring the detection value (S30), the identification unit 12 identifies whether or not a predetermined stop condition is satisfied.

In a case where a stop condition is satisfied (Yes in S31), the identification unit 12 outputs a stop command for stopping the operation of the power storage system (S33). Then, the identification unit 12 ends the processing. In accordance with the stop command, the power storage system stops the operation (for example, charging and discharging) of its own system.

On the other hand, in a case where the stop condition is not satisfied (No in S31), if there is no signal for terminating the process (No in S32), the detection unit 11 repeats the above process.

Returning to FIGS. 2 and 3, the decision unit 13 decides the operation continuable time of the power storage system after the type of fault is identified, based on the type of fault identified by the identification unit 12. As described above, the identification unit 12 identifies the type of fault, in accordance with the detection that the first condition is satisfied. Therefore, in a case where it is detected that the first condition is satisfied, the decision unit 13 decides the above-described operation continuable time. For example, the decision unit 13 can decide the operation continuable time according to the type of fault such as "one ground fault" or "communication failure of the power storage system". Note that, in a case where it is detected that the second condition is satisfied, as described above, the detection unit 11 outputs a stop command. Therefore, in a case where it is detected that the second condition is satisfied, the decision unit 13 may not decide the above-described operation continuable time.

For example, as shown in FIG. 6, the operation continuable time may be fixed corresponding to each of a plurality of types of faults. Then, the decision unit 13 may decide the operation continuable time corresponding to the identified type of fault, as the operation continuable time of the power storage system after identifying the type of the fault.

Figure 7:
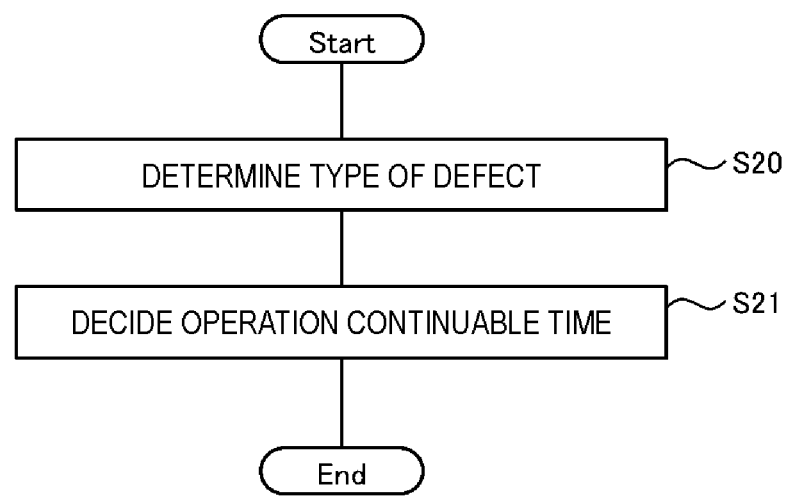
FIG. 7 is a flowchart showing an example of a process flow of the monitoring system of the present example embodiment.

Here, an example of the process flow by the identification unit 12 and the decision unit 13 will be described with reference to the flowchart of FIG. 7.

The identification unit 12 identifies the type of fault, in accordance with the detection that the first condition is satisfied (S20). Then, the decision unit 13 decides the operation continuable time of the power storage system after identifying the type of fault, according to the identification of the type of the fault (S21).

Returning to FIGS. 2 and 3, the monitoring unit 14 monitors whether an operation continuing time of the power storage system after identifying the type of fault does not exceed the operation continuable time. In a case where the operation continuing time exceeds the operation continuable time, a stop command for stopping the operation of the power storage system is output. In accordance with the stop command, the power storage system stops the operation (for example, charging and discharging) of its own system. The measurement start timing of "operation continuing time of the power storage system after identifying the type of fault" is a design matter.

It should be noted that, the monitoring unit 14 may acquire details of maintenance on the power storage system. The details of maintenance may include information such as contents and execution date and time of maintenance. For example, a user (for example, a maintenance worker, a user of a power storage system, or the like) may input the details of maintenance, through a terminal device such as a power storage system, a smartphone, a mobile phone, a tablet terminal, or a personal computer. The monitoring unit 14 may acquire the details of maintenance from the terminal device.

The monitoring unit 14 may stop the monitoring based on the operation continuable time corresponding to the type of fault, in a case where after the type of the fault is identified, the predetermined maintenance corresponding to the fault is executed. Further, in a case where the predetermined maintenance corresponding to the fault is executed after identifying the type of the fault, the identification unit 12 may stop monitoring whether or not the stop condition corresponding to the type of the fault is satisfied. The predetermined maintenance corresponding to the type of the fault may be predetermined and held in the monitoring unit 14.

Figure 8:
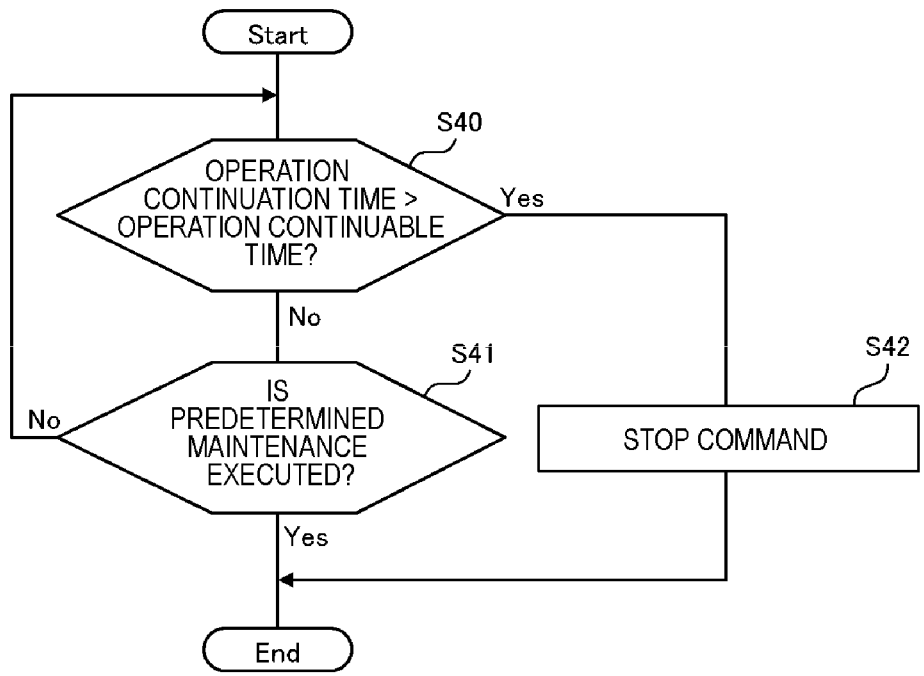
FIG. 8 is a flowchart showing an example of a process flow of the monitoring system of the present example embodiment.

Here, an example of the flow of the process by the monitoring unit 14 will be described with reference to the flowchart of FIG. 8.

In accordance with the decision of the operation continuable time, the monitoring unit 14 starts comparison of magnitude between the subsequent operation continuing time of the power storage system with the operation continuable time. When the operation continuing time exceeds the operation continuable time (Yes in S40), the monitoring unit 14 outputs a stop command for stopping the operation of the power storage system (S42), and ends the monitoring process. In accordance with the stop command, the power storage system stops the operation (for example, charging and discharging) of its own system.

On the other hand, in a case where the operation continuing time does not exceed the operation continuable time (No in S40) and in a case where execution of the predetermined maintenance is not confirmed (No in S41), the monitoring unit 14 repeats the above process. Note that, in a case where execution of the predetermined maintenance is confirmed (Yes in S41), the monitoring unit 14 ends the monitoring process.

Here, an application example of the monitoring system 10 of the present example embodiment will be described. The monitoring system 10 may be configured with a single apparatus, or may be realized by a plurality of apparatuses separated physically and/or logically from each other.

Figure 9:
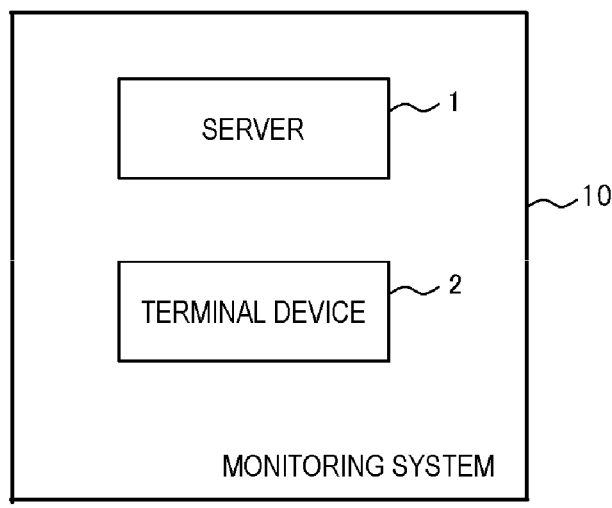
FIG. 9 is a functional block diagram showing an example of an application example of the monitoring system of the present example embodiment.

For example, as shown in FIG. 9, the monitoring system 10 may be realized by the server 1 and the terminal device 2. The server 1 and the terminal device 2 are configured to communicate with each other by any communication means. In this case, the terminal device 2 may include the detection unit 11, and the server 1 may include the decision unit 13. The server 1 or the terminal device 2 may include the identification unit 12. The server 1 or the terminal device 2 may include the monitoring unit 14.

In this case, the terminal device 2 may transmit the detection result by the detection unit 11 to the server 1. The terminal device 2 may transmit the detection result of satisfying the first condition and the detection result of satisfying the second condition to the server 1. The server 1 can store the received information in association with each power storage system.

Figure 10:
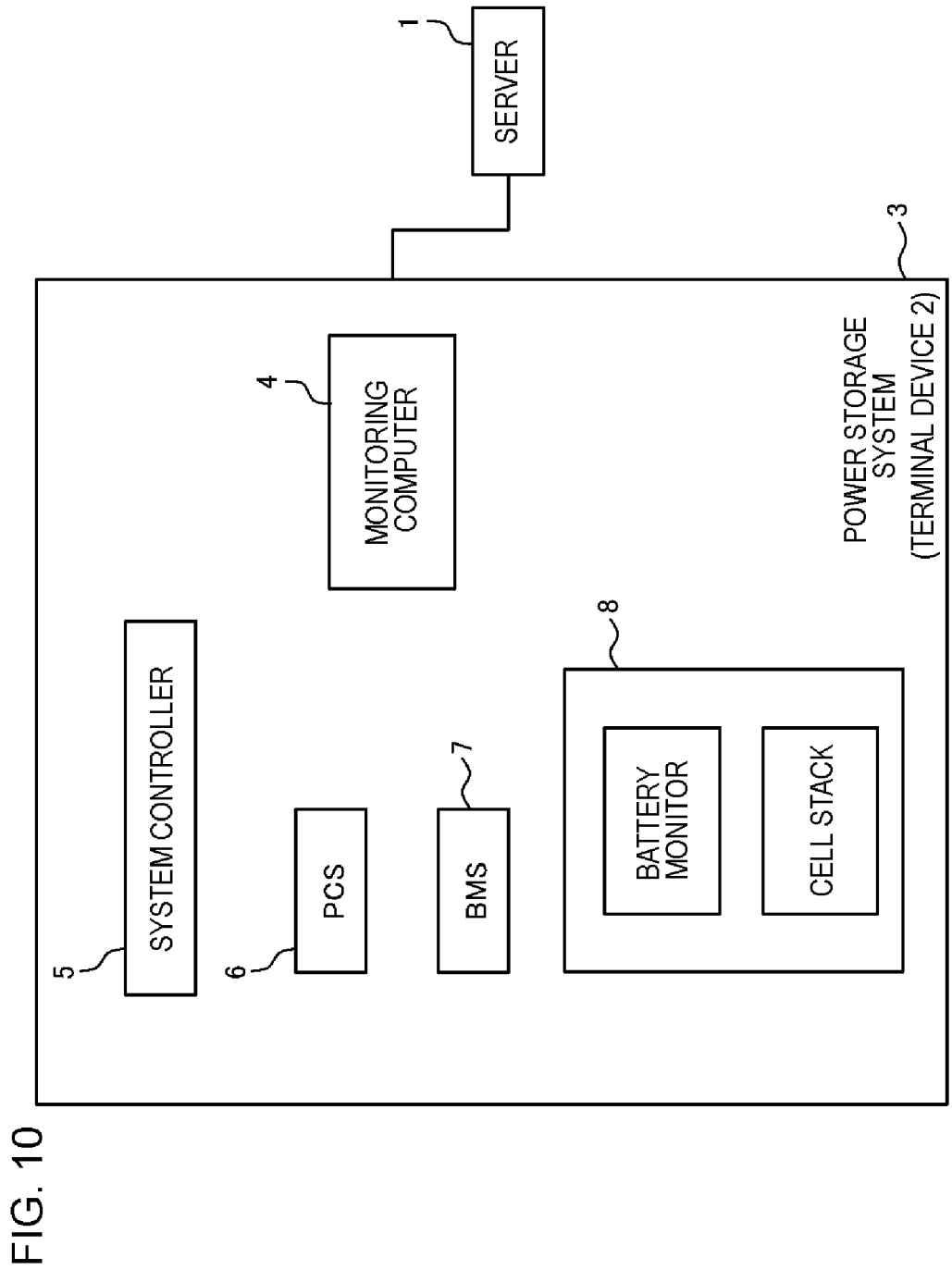
FIG. 10 is a functional block diagram showing an example of an application example of the monitoring system of the present example embodiment.

Here, FIG. 10 shows a configuration example of the monitoring system 10. In the case of the illustrated example, a power storage system 3 also serves as the terminal device 2. The power storage system 3 includes a monitoring computer 4, a system controller 5, a power conditioning system (PCS) 6, a battery management system (BMS) 7, and a battery 8.

The monitoring computer 4 includes a detection unit 11. In a case where the terminal device 2 includes the identification unit 12 and the monitoring unit 14, the monitoring computer 4 has these functional units. The system controller 5 controls the entire power storage system 3. The PCS 6 performs conversion of DC power/AC power. The battery 8 stores electric power. The battery 8 includes, for example, a cell stack that stores energy, a battery monitor that monitors a cell temperature, cell voltage, or the like. The BMS 7 controls the battery 8.

Figure 11:
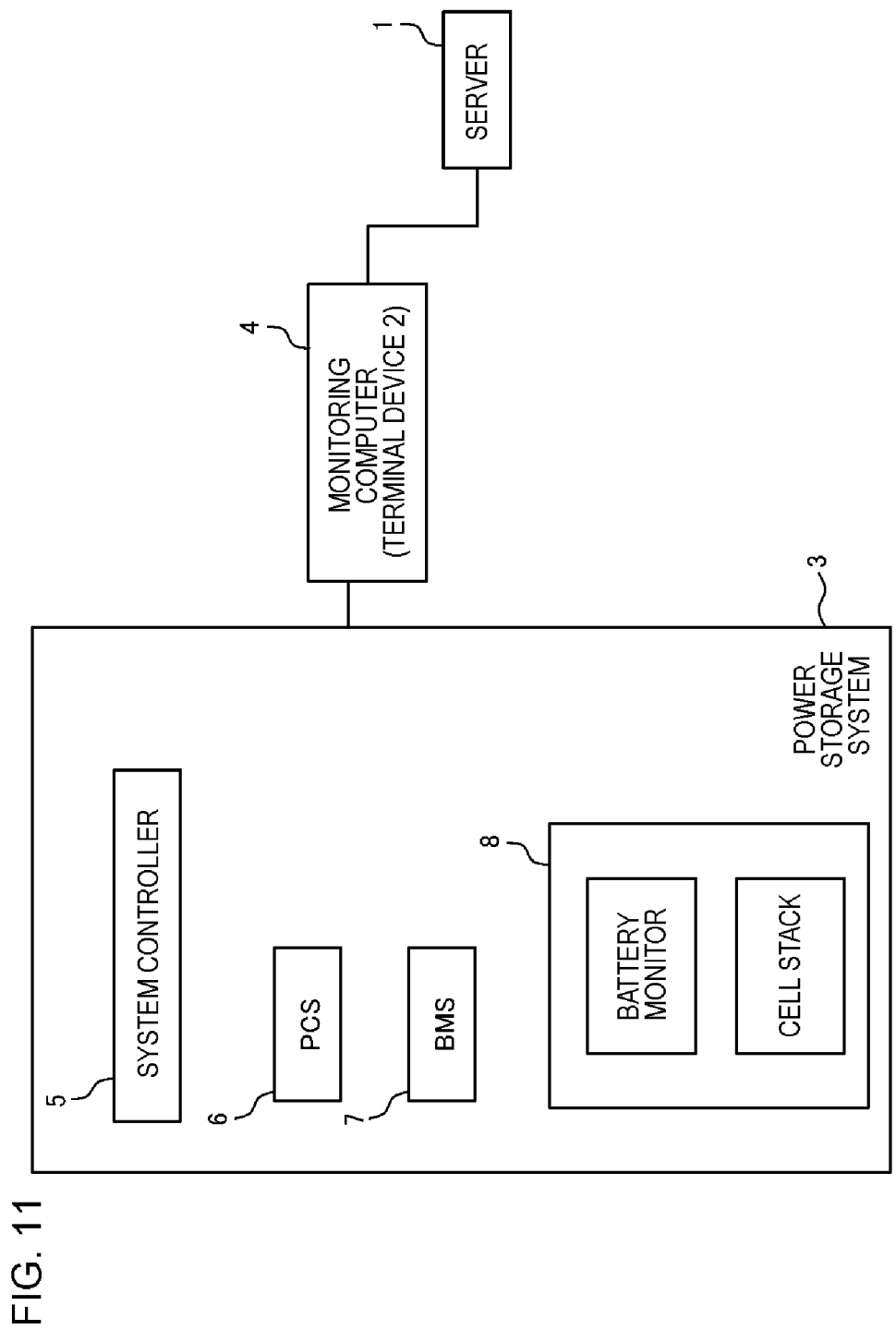
FIG. 11 is a functional block diagram showing an example of an application example of the monitoring system of the present example embodiment.

Here, FIG. 11 shows another configuration example of the monitoring system 10. In the illustrated example, a terminal device 2 that is physically and/or logically separated from the power storage system 3 is provided. The terminal device 2 is installed corresponding to the power storage system 3 to be monitored. The terminal device 2 includes the monitoring computer 4. The power storage system 3 includes a system controller 5, the PCS 6, the BMS 7, and the battery 8.

As another example, the server 1 or the terminal device 2 may be the monitoring system 10. In other words, one of the server 1 and the terminal device 2 may include all of the detection unit 11, the identification unit 12, the decision unit 13, and the monitoring unit 14.

Next, examples will be described. The power storage system includes a plurality of cell stacks connected in parallel with each other. Each cell stack has a plurality of cells connected in series with each other.

The detection unit 11 periodically acquires the insulation resistance value of each of the plurality of cell stacks at a first time interval. Then, the detection unit 11 detects that the insulation resistance value falls below the first reference value (design matter) as the first condition. Note that, the detection unit 11 may continue to compare the insulation resistance value with the first reference value even after detecting the first condition. In this case, the detection unit 11 may set the time interval for acquiring the insulation resistance value after detecting the first condition to be shorter than the first time interval.

In accordance with the detection, the identification unit 12 acquires the voltage value of each of the plurality of cells of the cell stack whose cell voltage falls below the first reference value. Then, the identification unit 12 may identify that a ground fault has occurred when the voltage value falls below the second reference value (design matter). Note that, the identification unit 12 can identify that a ground fault has occurred by the number of cells whose voltage value falls below the second reference value. The second reference value may be fixed in advance or may be computed based on voltage values of a plurality of cells.

In a case where a ground fault is not identified (in a case where the voltage values of all the cells fall below the second reference value), the identification unit 12 outputs a request for maintenance such as cleaning and inspection. The insulation resistance value may decrease due to the presence of dust or the like. Therefore, in a case where the insulation resistance value of the cell stack falls below the first reference value, but none of the voltage values of all the cells of the cell stack, whose cell voltage falls below the first reference value, falls below the second reference value, maintenance such as cleaning and inspection is requested.

In a case where two or more ground faults are identified (in a case where the stop condition is satisfied), the identification unit 12 outputs a stop command for stopping the operation of the power storage system. In accordance with the stop command, the power storage system stops the operation (for example, charging and discharging) of its own system.

In a case where one ground fault is identified, the decision unit 13 decides the operation continuable time according to the type of the fault. Then, the monitoring unit 14 starts monitoring whether an operation continuing time of the power storage system after identifying the type of fault does not exceed the operation continuable time. When the operation continuing time exceeds the operation continuable time, the monitoring unit 14 outputs a stop command for stopping the operation of the power storage system. In accordance with the stop command, the power storage system stops the operation (for example, charging and discharging) of its own system.

It should be noted that, in a case where one ground fault is identified, the identification unit 12 can start monitoring whether or not the detection value satisfies the stop condition "occurrence of two or more ground faults". Then, when the detection value satisfies the stop condition, the identification unit 12 outputs a stop command for stopping the operation of the power storage system. In accordance with the stop command, the power storage system stops the operation (for example, charging and discharging) of its own system. Note that, acquisition of the detection value for the monitoring by the identification unit 12 can be performed periodically at a second time interval. The second time interval may be shorter than the first time interval.

Although it is possible to decide the time with a low probability of occurrence of the second ground fault as the operation continuable time, a second ground fault may occur during that time. Through the monitoring process by the identification unit 12, even in a case where such an inconvenience occurs, the power storage system can be stopped, and safety can be secured.

As a modification example of the example, the identification unit 12 may perform a process of acquiring the execution duration of the cell balance of each of the plurality of cells, instead of or in addition to the process of acquiring the voltage value of each of the plurality of cells in accordance with the detection. Then, the identification unit 12 may identify that a ground fault has occurred when the execution duration of the cell balance exceeds the third reference value (design matter). Note that, the identification unit 12 can identify that ground faults occurs by the number of cells whose execution duration of the cell balance exceeds the third reference value (design matter). The third reference value may be determined in advance or may be computed based on the execution duration of the cell balance of the plurality of cells.

According to the monitoring system 10 of the present example embodiment described above, in a case where a minor fault occurs in the power storage system (in a case where the detection value satisfies the first condition), a subsequent operation continuable time can be decided according to the type of fault that has occurred. Then, the monitoring system 10 monitors whether the subsequent operation continuing time of the power storage system does not exceed the operation continuable time, and can stop the operation of the power storage system in a case where the subsequent operation continuing time exceeds the operation continuable time.

In such a case, the power storage system can continue the operation as it is, with the operation continuable time as the upper limit, even after the minor fault has occurred. Therefore, the utilization efficiency of the power storage system can be enhanced.

It should be noted that, when the operation continuable time is exceeded, the operation of the power storage system can be stopped. By appropriately setting the operation continuable time, the operation of the power storage system can be stopped, before a serious secondary fault caused by a minor fault occurs. Therefore, sufficient safety can be secured.

Further, the monitoring system 10 of the present example embodiment can immediately stop the operation of the power storage system, in a case where a serious fault occurs in the power storage system (the detection value satisfies the second condition). Therefore, sufficient safety can be secured.

Further, the monitoring system 10 of the present example embodiment can monitor whether or not the detection value relating to the power storage system satisfies the stop condition even during operation of the power storage system after a minor fault occurs. Then, in a case where the stop condition is satisfied, even when the operation continuing time does not exceed the operation continuable time, the operation of the power storage system can be stopped immediately. Therefore, sufficient safety can be secured.

Further, the monitoring system 10 of the present example embodiment acquires information on maintenance of the power storage system, and is able to decide whether to continue or stop the monitoring (monitoring whether or not it does not exceed the operation continuable time and whether or not the stop condition is satisfied), depending on the maintenance state. Therefore, it is possible to avoid inconvenience that the operation of the power storage system is stopped due to the operation continuing time exceeding the operation continuable time despite having performed maintenance. Further, despite having performed maintenance, waste of continuing the monitoring can be avoided. As a result, the burden on the computer can be reduced.

Further, according to the monitoring system 10 of the present example embodiment, in a case where one ground fault occurs in the power storage system, the operation of the power storage system is continued, and in a case where two or more ground faults occur in the power storage system, the operation of the power storage system can be stopped. In such a case, it is possible to enhance utilization efficiency of the power storage system while ensuring safety.

Further, according to the monitoring system 10 of the present example embodiment, by appropriately setting the conditions (a second condition, a stop condition, an operation continuable time, or the like) for stopping the operation of the power storage system, it is possible to stop the operation of the power storage system before a serious problem occurs in the power storage system. Therefore, it is possible to alleviate the inconvenience that the value of the power storage system decreases due to the occurrence of a serious problem.

Second Example Embodiment

First, the outline of the present example embodiment will be described. In the monitoring system 10 of the present example embodiment, in a case where a fault (including a minor fault and a serious fault) occurs in a power storage system, the type of the fault that has occurred is identified. Then, the monitoring system 10 can compute the life of the power storage system, based on the identified type of the fault.

According to the monitoring system 10 of the present example embodiment as described above, the user can grasp the current value of the power storage system (for example, the value is higher as the life is longer), based on the life of the storage battery. In such a case, the user can take appropriate measures (for example, maintenance, parts replacement, improvement of usage, or the like), based on the grasped value. As a result, a decline in the value of the power storage system can be suppressed.

The hardware configuration of the monitoring system 10 of the present example embodiment is, for example, similar to the hardware configuration of the monitoring system 10 of the first example embodiments.

Next, the functions of the monitoring system 10 of the present example embodiment will be described in detail. FIG. 2 shows an example of a functional block diagram of the monitoring system 10 of the present example embodiment. As shown in FIG. 2, the monitoring system 10 includes a detection unit 11, an identification unit 12, and a decision unit 13.

FIG. 3 shows another example of the functional block diagram of the monitoring system 10 of the present example embodiment. As shown in FIG. 3, the monitoring system 10 may include a monitoring unit 14 in addition to the detection unit 11, the identification unit 12, and the decision unit 13.

The detection unit 11 detects that the detection value relating to the power storage system satisfies the condition. The detection process is the same as the detection process by the detection unit 11 in first example embodiment.

The detection unit 11 notifies the identification unit 12 of the detection result (in the case of the present example embodiment, the detection result of satisfying the first condition and the detection result of satisfying the second condition). The detection result may include detection timing (example: detection date and time), detection contents (example: satisfied condition), a detection value, or the like. In the case of the present example embodiment, the detection unit 11 may notify the identification unit 12 of the detection result every time it is detected, or may notify the identification unit 12 of the detection results so far at predetermined time intervals.

It should be noted that, the detection unit 11 may have the function described in the first example embodiment.

The identification unit 12 identifies the type of fault which occurs in the power storage system satisfying the above condition. The method of identifying the type of fault is the same as that of the first example embodiment. Note that, the identification unit 12 in the present example embodiment identifies the type of fault occurring in the power storage system, in a case where the second condition is satisfied. The method of identifying the type of fault in the case where the second condition is satisfied can be realized in the same way as the method of identifying the type of fault in the case where the first condition is satisfied.

It should be noted that, the identification unit 12 may have the function described in the first example embodiment.

The decision unit 13 computes the life (remaining life) of the power storage system, based on the type of fault identified by the identification unit 12. The decision unit 13 may compute the life based on the elapsed time of various types of faults. "The elapsed time of various types of faults" is the time during which the fault continuously occurs in the power storage system. For example, even after the detection value satisfies the condition, the detection unit 11 may continue to determine whether or not the detection value satisfies the condition, at predetermined time intervals. Further, even after identifying the type of fault, the identification unit 12 may continue to determine whether or not the condition for identifying the type of fault is satisfied, at predetermined time intervals. Based on this result, the time during which a predetermined fault continues can be identified.

The method of computing the life is a design matter. For example, the decision unit 13 may previously store information indicating a standard remaining life corresponding to the years of use. Further, the decision unit 13 may grasp the years of use of the power storage system (for example, previously receives a user input and an input about the use-starting year and month at a time of service start, and computes the years of use by using the elapsed time from the use-starting timing and the information), and specify the remaining life according to the grasped years of use. Then, the decision unit 13 may compute the remaining life by subtracting the correction value computed based on the type, the elapsed time, or the like of the fault identified by the identification unit 12, from the specified standard remaining life. For example, for the type of the fault having a large influence on the reduction of the life, a large correction value may be computed. Further, the longer the elapsed times of various faults are, a larger correction value may be computed.

It should be noted that, the decision unit 13 may have the function described in the first example embodiment.

The function of the monitoring unit 14 is the same as in the first example embodiment.

The monitoring system 10 may send notification of the remaining life of the power storage system, in response to a request from another user. Further, in a case where the computed remaining life deviates by a predetermined level or more from the standard remaining life at the current time, the monitoring system 10 may notify a predetermined user of the fact by an e-mail or the like, or output a warning to the power storage system.

The application example of the monitoring system 10 of the present example embodiment is the same as the application example of the first example embodiment described with reference to FIGS. 9 to 11.

According to the monitoring system 10 of the present example embodiment described above, it is possible to compute the remaining life of the power storage system, based on the fault occurring in the power storage system. It is possible to grasp the value of the power storage system at that time, based on the remaining life.

In such a case, the user can take appropriate measures (for example, maintenance, parts replacement, improvement of usage, or the like), based on the grasped value. As a result, a decline in the value of the power storage system can be suppressed.

Further, in a case where the computed remaining life deviates by a predetermined level or more from the standard remaining life at the current time, the monitoring system 10 of the present example embodiment can notify the predetermined user of the fact by an e-mail or the like, or output a warning to the power storage system.

In such a case, the user can grasp that the value of the power storage system is lower than the standard, based on the notified contents. Based on the grasped value, it is possible to promptly take appropriate measures (for example, maintenance, parts replacement, improvement of usage, or the like), based on the grasped value. As a result, a decline in the value of the power storage system can be suppressed, as compared with the case where the state is left unattended.

Third Example Embodiment

First, the outline of the present example embodiment will be described. In a case where the monitoring system 10 of the present example embodiment detects that a predetermined prohibited action has been performed in relation to the power storage system, the monitoring system 10 identifies the type of the detected prohibited action. Then, the monitoring system 10 can compute the life of the power storage system, based on the identified type of the prohibited action. For example, a matter that can cause a decrease in the life of the power storage system can be predetermined as the prohibited action.

According to the monitoring system 10 of the present example embodiment as described above, the user can grasp the current value of the power storage system (for example, the value is higher as the life is longer), based on the life of the storage battery. In such a case, the user can take appropriate measures (for example, maintenance, parts replacement, improvement of usage, or the like), based on the grasped value. As a result, a decline in the value of the power storage system can be suppressed.

The hardware configuration of the monitoring system 10 of the present example embodiment is, for example, similar to the hardware configurations of the monitoring systems 10 of the first and second example embodiments.

Next, the functions of the monitoring system 10 of the present example embodiment will be described in detail. FIG. 2 shows an example of a functional block diagram of the monitoring system 10 of the present example embodiment. As shown in FIG. 2, the monitoring system 10 includes a detection unit 11, an identification unit 12, and a decision unit 13.

The detection unit 11 detects that the detection value relating to the power storage system satisfies the condition. The detection value is a value for detecting that a predetermined prohibited action has been performed in relation to the power storage system. The detection unit 11 can acquire the detection value from a power storage system, a sensor attached to the power storage system, or the like.

The prohibited action is, for example, a matter that can cause a decrease in the life of the power storage system. As an example of prohibited acts, the following (1) to (11) are illustrated, but the present invention is not limited thereto. For example, the detection unit 11 detects at least one of the following (1) to (11).

(1) Use of the power storage system for purposes other than a predetermined purpose.

(2) Illegal modification of the power storage system.

(3) Covering the ventilation opening provided in the power storage system.

(4) At least one of the integrated value of the charged electric power amount and the integrated value of the discharged electric power amount within the predetermined period exceeding a predetermined upper limit value.

(5) SOC (State Of Charge) of the storage battery system exceeding a predetermined upper limit value.

(6) SOC of the storage battery system falling below a predetermined lower limit value.

(7) The temperature of the power storage system or the temperature of the room where the power storage system is installed exceeding a predetermined upper limit value.

(8) Stopping the air conditioner installed in the room where the power storage system is installed.

(9) Moving the installation position of the power storage system from a determined position.

(10) Non-execution of maintenance of the power storage system.

(11) Reset operation for a predetermined number of times or more.

Hereinafter, the contents of the prohibited actions of (1) to (11) and an example of the process of detecting the execution thereof will be described.

"(1) Use of the power storage system for purposes other than a predetermined purpose"

The administrator of the power storage system can obtain various benefits by using the power storage system for various purposes. For example, by performing charging during the night when the electricity charge is relatively low and discharging during the daytime when the electricity charge is relatively high, it is possible to suppress the electricity charge to be paid to the electric power company (hereinafter referred to as "night charging and daytime discharging"). Hereinafter, night charging and daytime discharging is referred to as "first purpose". In addition, the administrator of the power storage system can receive an incentive by participating in a service (for example, ancillary service) provided by an electric power-related business entity and using the power storage system. In a case of participating in the service, charging and discharging is performed from the power storage system to adjust the supply and demand balance of the electric power system, charging and discharging is performed from the power storage system in a case where the retail electricity business has a difficulty in attaining the 30-minute power balancing by adjusting its own system, or charging the power storage system is performed based on a request from a power generation company possessing a power generation apparatus or the like that uses natural energy (for example, solar light) (for example, in a case where output suppression is received from a transmission and distribution power company). Hereinafter, the participation in the service provided by an electric power-related business entity is referred to as the "second purpose". In addition, in a case where the administrator of the power storage system holds a power generation apparatus using natural energy (for example, solar light), an example is considered in which surplus electric power (power not consumed by the load) generated during the daytime by the power generation apparatus is stored in the power storage system. Hereinafter, the charging of surplus power of the power generating apparatus is referred to as "third purpose".

However, in a case where the power storage system is used for various purposes, charging and discharging may be repeated many times in a short time period. As a result, reduction of the life of the power storage system can be accelerated. Therefore, it is thought that the interested person who wants to suppress the decline in the value of the power storage system, such as leasing companies leasing power storage systems, or financial institutions that lend money with the power storage system as collateral, wishes it to be used only for a predetermined purpose. Then, for example, the use of the power storage system for purposes other than the predetermined purpose may be set as a prohibited action.

The detection unit 11 can detect usage for purposes other than the predetermined purpose, by various methods. For example, the detection unit 11 may detect use of the power storage system for purposes other than the purpose, based on a pattern of a temporal change of charging and discharging of the power storage system within a predetermined time (for example, one day). It is considered that a characteristic part appears in the above pattern for each use purpose. For example, in the case of night charging and daytime discharging, the power storage system performs charging in the night and discharging in the daytime. Therefore, charging does not appear in the daytime and discharge does not appear at night. The detection unit 11 may detect usage for purposes other than the purpose, by checking whether or not there is a feature appearing at the time of use for purposes other than the purpose in the above pattern of the power storage system.

For example, the use for the first purpose and the use for the second and third purposes can be distinguished based on "presence or absence of daytime charging". In the case of the use for the first purpose, charging is not performed in the daytime. On the other hand, in the case of the use for the second and third purposes, charging is performed in the daytime. The use for the second purpose and the use for the third purpose can be distinguished based on "charging and discharging mode". In the case of the use for the second purpose, compared with the use for the third purpose, the frequency of repetition of charging and discharging increases, the cycle becomes shorter, the increase or decrease of the output on the charging side is repeated in a short cycle, and the increase or decrease of the output on the discharge side is repeated in a short cycle. These features can be used to distinguish between the use for the second purpose and the use for the third purpose.

"(2) Illegal modification of the power storage system"

If the power storage system is illegally modified, reduction of the life of the power storage system can be accelerated due to use of inexpensive parts or poor handling. Therefore, in order to suppress the decline in the value of the power storage system, illegal modification of the power storage system may be set as a prohibited action.

The detection unit 11 can detect illegal modification by various methods. For example, the detection unit 11 may detect illegal modification, based on the temporal change of the integrated value of the discharged electric power amount of the power storage system. The trend of the temporal change of the above integrated value may change due to an exchange to an inexpensive part due to illegal modification, occurrence of fault in poor handling, or the like. Specifically, the increase rate of the integrated value (the increase amount of the integrated value within the predetermined period) decreases. The detection unit 11 may detect illegal modification by detecting a change of the trend (for example, the increase rate of the integrated value) equal to or more than a predetermined level.

In addition, the detection unit 11 may detect illegal modification, based on a temporal change in the state of health (SOH) of the power storage system. Illegal modification causes the trend of the temporal change of the SOH to be changed. Specifically, the reduction rate of SOH (the decrease amount of SOH within the predetermined period) increases. The detection unit 11 may detect illegal modification by detecting a change of the trend (for example, reduction rate) equal to or more than a predetermined level.

In addition, the detection unit 11 may detect illegal modification, based on a temporal change in the temperature of the power storage system. The temperature of the power storage system tends to increase due to illegal modification. In other words, the rate of rise in temperature (the rise value of the temperature within the predetermined time) increases due to illegal modification. The detection unit 11 may detect illegal modification by detecting a change of the trend (for example, the rate of rise in temperature) equal to or more than a predetermined level.

"(3) Covering the ventilation opening provided in the power storage system"

When the ventilation opening of the power storage system is covered, the internal temperature rises, which can accelerate reduction of the life of the power storage system. Therefore, in order to suppress the decline in the value of the power storage system, covering the ventilation opening may be set as a prohibited action.

The detection unit 11 can detect that the ventilation opening of the power storage system is covered, by various methods. For example, the detection unit 11 may detect that the ventilation opening is covered, based on the pressure in the closed space having the ventilation opening. When the ventilation opening is closed, it can be considered that the pressure in the space rises. The detection unit 11 may detect that the ventilation opening is closed, by detecting that the pressure in the space exceeds a reference value.

In addition, the detection unit 11 may detect that the ventilation opening is covered, based on the temperature in the closed space having the ventilation opening. When the ventilation opening is covered, it can be considered that the temperature in the space rises. The detection unit 11 may detect that the ventilation opening is closed, by detecting that the temperature in the space exceeds a reference value.

"(4) At least one of the integrated value of the charged electric power amount and the integrated value of the discharged electric power amount within the predetermined period exceeding a predetermined upper limit value"

In a case where charging and discharging are repeated frequently in a short time period, reduction of the life of the power storage system can be accelerated. Therefore, in order to suppress a decline in the value of the power storage system, a fact that at least one of the integrated value of the charged electric power amount or the integrated value of the discharged electric power amount within the predetermined period exceeds the predetermined upper limit value may be set as a prohibited action.

The detection unit 11 can detect the prohibited action, by comparing at least one of an integrated value (measured value) of the charged electric power amount and an integrated value (measured value) of the discharged electric power amount within a predetermined period (design matter) with a predetermined upper limit value.

"(5) SOC of the storage battery system exceeding a predetermined upper limit value and (6) SOC of the storage battery system falling below a predetermined lower limit value"

Reduction of the life of the power storage system can be accelerated by overcharging (SOC exceeds the upper limit reference value) and over-discharging (SOC falls below the lower limit reference value). Therefore, in order to suppress the decline in the value of the power storage system, use that deviates from the range defined by at least one of the upper limit or the lower limit of the SOC may be set as a prohibited action.

The detection unit 11 can detect the prohibited action, by comparing the SOC (measured value) with the upper limit value and/or the lower limit value.

"(7) The temperature of the power storage system or the temperature of the room where the power storage system is installed exceeding a predetermined upper limit value"

When it is used at high temperature or the like, reduction of the life of the power storage system can be accelerated. Further, if the power storage system is used such that the temperature thereof exceeds a predetermined upper limit value, reduction of the life of the power storage system can be accelerated. Therefore, in order to suppress the decline in the value of the power storage system, a fact that the temperature of the power storage system or the temperature of the room in which the power storage system is installed exceeds the predetermined upper limit value may be set as a prohibited action.

The detection unit 11 can detect the prohibited action, by comparing the temperature of the room or the temperature of the power storage system with the upper limit value.

"(8) Stopping the air conditioner installed in the room where the power storage system is installed"

When the air conditioner installed in the room where the power storage system is installed is stopped, the temperature of the room can rise. When it is used under such circumstances, reduction of the life of the power storage system can be accelerated. Therefore, in order to suppress the decline in the value of the power storage system, the stop of the air conditioner may be set as a prohibited action.

The detection unit 11 can detect the stop of the air conditioner by various methods. For example, the detection unit 11 may acquire information indicating the state (operating, being stopped) from the controller of the air conditioner. The detection unit 11 can detect the stop of the air conditioner, based on the information.

It should be noted that, the prohibited action (stop of the air conditioner) may be conditionally applied. In other words, in a case where there is no problem even if the air conditioner is stopped, the prohibited action may not be applied. For example, in a case where the condition such as "the room temperature is less than the predetermined value" or "the predetermined period of the year (the period during which the temperature becomes low)" is satisfied, the prohibited action may not be applied.

"(9) Moving the installation position of the power storage system from a determined position"

Reduction of the life of the power storage system can be accelerated by installing and using the power storage system under harsh environments such as in the scorching sun or high temperature. Therefore, in order to suppress the decline in the value of the power storage system, the movement of the power storage system may be set as a prohibited action.

The detection unit 11 can detect the movement of the power storage system by various methods. For example, the detection unit 11 may detect the movement of the power storage system by detecting that the measured value of the vibration sensor attached to the power storage system exceeds a predetermined value. In addition, the power storage system may be provided with a position information acquisition means such as a global positioning system (GPS) and may periodically transmit the position information of the power storage system to the monitoring system 10. Then, the detection unit 11 may detect the movement of the power storage system, based on the position information. In addition, a camera that images the prescribed installation position of the power storage system may transmit imaging data to the monitoring system 10. Then, the detection unit 11 may detect the movement of the power storage system by analyzing the image.

"(10) Non-execution of maintenance of the power storage system"

By periodically performing maintenance, it is possible to suppress reduction of the life of the power storage system. Maintenance may be performed automatically by a computer or may be performed by the worker. Even if the computer performs maintenance, the user of the power storage system may perform an operation to postpone the execution of maintenance, for example, by giving priority to the use of the power storage system (the operation of the power storage system needs to be stopped during maintenance). Examples of maintenance include filter cleaning, cooling water replenishment, refresh charging, parts replacement, or the like, but the present invention is not limited thereto. Therefore, in order to suppress the decline in the value of the power storage system, non-execution of maintenance may be set as a prohibited action.

The detection unit 11 can detect non-execution of maintenance by various methods. For example, the detection unit 11 may acquire information indicating the details of maintenance, from the power storage system. The power storage system may acquire the details of maintenance on the basis of information collected by sensors attached to the power storage system. In addition, the detection unit 11 may acquire details of maintenance inputted by the user, from the terminal device of the user (for example, a maintenance worker, the user of the power storage system, or the like). Then, based on these pieces of information, the detection unit 11 may detect that maintenance has not been performed (non-execution of maintenance) by a predetermined time limit.

"(11) Reset operation for a predetermined number of times or more"

The power storage system for which the prohibited action is set is configured to stop its operation in response to a predetermined event. The predetermined event is any event possibly accelerating reduction of the life of the power storage system. Then, in response to reset operation after the stop, the power storage system releases the stop and transitions again to the operable state.

When the operation is stopped in response to a predetermined event, maintenance such as cleaning and inspection is desired to be performed. However, there are cases where priority is given to using the power storage system, a reset operation is performed without maintenance, and the power storage system is used as it is. In such a case, a serious problem may occur in the power storage system after that. As a result, reduction of the life of the power storage system can be accelerated. Therefore, in order to suppress the decline in the value of the power storage system, a reset operation of a predetermined number of times or more may be set as a prohibited action. Note that, the number of reset operations detected may be a cumulative number from the start of use of the power storage system, or may be a cumulative number within the most recent predetermined period.

The detection unit 11 acquires information on the reset operation from the power storage system and can detect reset operations of more than a predetermined number of times, based on the information.

It should be noted that, the detection unit 11 may have the functions described in the first and second example embodiments.

The identification unit 12 identifies the type of a prohibited action performed in the power storage system. The identification unit 12 can identify the type of the prohibited action performed in the power storage system, based on the detection result (which condition the detection value satisfies) obtained by the detection unit 11. Note that, the identification unit 12 may have the functions described in the first and second example embodiments.

The decision unit 13 computes the life (remaining life) of the power storage system, based on the type of prohibited action identified by the identification unit 12. The decision unit 13 may compute the above life based on the elapsed times of various types of prohibited actions.

The "elapsed times of various types of prohibited actions" is the time during which execution of prohibited actions is continued. For example, an integration time during which the power storage system is used for other purposes, an integration time during which the ventilation opening is kept in a covered state, an integration time during which a state where the SOC exceeds the upper limit value is kept, an integration time during which a state where the SOC is below the lower limit value is kept, an integrated time during which a state where the temperature of the power storage system or the temperature of a room where the power storage system is installed exceeds a predetermined upper limit value is kept, an integrated time during which the air conditioner installed in the room with the power storage system is kept in a stopped state, an integrated time during which the power storage system is kept in a state where it is moved from a predetermined position, and an integration time during which non-execution of the maintenance of the power storage system is kept (a state where maintenance has not been performed up to a predetermined time limit) are illustrated. Such measurement of the elapsed time can be realized by any means.

The method of computing the life is a design matter. For example, the decision unit 13 may previously store information indicating a standard remaining life corresponding to the years of use. Further, the decision unit 13 may grasp the years of use of the power storage system (for example, previously receives a user input and an input about the use-starting year and month at a time of service start, and computes the years of use by using the elapsed time from the use-starting timing and the information), and specify the remaining life according to the grasped years of use. Then, the decision unit 13 may compute the remaining life by subtracting the correction value computed based on the type, the elapsed time, or the like of the prohibited action identified by the identification unit 12, from the specified standard remaining life. For example, for the type of the prohibited action having a large influence on the reduction of the life, a large correction value may be computed. Further, as the elapsed time of the type of prohibited action is longer, a larger correction value may be computed.

It should be noted that, the decision unit 13 may have the functions described in the first and second example embodiments.

The monitoring system 10 may send notification of the remaining life of the power storage system, in response to a request from another user. Further, in a case where the computed remaining life deviates by a predetermined level or more from the standard remaining life at the current time, the monitoring system 10 may notify a predetermined user of the fact by an e-mail or the like, or output a warning to the power storage system.

The application example of the monitoring system 10 of the present example embodiment is the same as the application example of the first example embodiment described with reference to FIGS. 9 to 11.

According to the monitoring system 10 of the present example embodiment described above, it is possible to compute the remaining life of the power storage system, based on the prohibited action performed in the power storage system. It is possible to grasp the value of the power storage system at that time, based on the remaining life.

In such a case, the user can take appropriate measures (for example, maintenance, parts replacement, improvement of usage, or the like), based on the grasped value. As a result, a decline in the value of the power storage system can be suppressed.

Further, in a case where the computed remaining life deviates by a predetermined level or more from the standard remaining life at the current time, the monitoring system 10 of the present example embodiment can notify the predetermined user of the fact by an e-mail or the like, or output a warning to the power storage system.

In such a case, the user can grasp that the value of the power storage system is lower than the standard, based on the notified contents. It is possible to promptly take appropriate measures (for example, maintenance, parts replacement, improvement of usage, or the like), based on the grasped value. As a result, a decline in the value of the power storage system can be suppressed as compared with the case of leaving the state.

Fourth Example Embodiment

First, the outline of the present example embodiment will be described. In a case where the monitoring system of the present example embodiment detects that a predetermined prohibited action has been performed in relation to the power storage system, the monitoring system decides a subsequent operation continuable time according to the type of the performed prohibited action. In such a case, the power storage system can continue to operate as it is even after the prohibited action is performed. Then, in a case where an operation continuing time exceeds an operation continuable time, the monitoring system can stop the operation of the power storage system.

It is not preferable to stop the operation of the power storage system suddenly in accordance with the detection of the prohibited action in consideration of the benefit of the user of the power storage system. However, if the state is left unattended despite the execution of the prohibited action, the value of the power storage system can be significantly reduced. As a result, lease companies lending power storage systems, financial institutions that lend money with the power storage system as collateral, or the like may suffer disadvantages.

According to the present example embodiment, in consideration of the balance between the user of the power storage system and the interested person who dislikes a decline in the value of the power storage system, it is possible to stop the operation of the power storage system at an appropriate timing. As a result, it is possible to suppress the inconvenience that the value of the power storage system decreases while maintaining the benefit of the user of the power storage system.

The hardware configuration of the monitoring system 10 of the present example embodiment is, for example, similar to the hardware configurations of the monitoring systems 10 of the first to third example embodiments.

Next, the functions of the monitoring system 10 of the present example embodiment will be described in detail. FIG. 2 shows an example of a functional block diagram of the monitoring system 10 of the present example embodiment. As shown in FIG. 2, the monitoring system 10 includes a detection unit 11, an identification unit 12, and a decision unit 13.

FIG. 3 shows another example of the functional block diagram of the monitoring system 10 of the present example embodiment. As shown in FIG. 3, the monitoring system 10 may include a monitoring unit 14 in addition to the detection unit 11, the identification unit 12, and the decision unit 13.

The function of the detection unit 11 is the same as that of the third example embodiment. Note that, the detection unit 11 may have the functions in the first and second example embodiments.

The function of the identification unit 12 is the same as that of the third example embodiment. Note that, the identification unit 12 may have the functions in the first and second example embodiments.

The decision unit 13 decides, based on the type of prohibited action identified by the identification unit 12, the operation continuable time of the power storage system after the identification. For example, as shown in FIG. 12, the operation continuable time may be fixed corresponding to each of a plurality of types of prohibited actions. Then, the decision unit 13 may decide the operation continuable time corresponding to the identified type of prohibited action as the operation continuable time of the power storage system after identifying the prohibited action. Note that, various types of prohibited actions may include an action having the corresponding operation continuable time "0". In a case where the operation continuable time "0" is decided, the monitoring system 10 outputs a stop command for stopping the operation of the power storage system according to the decision. In accordance with the stop command, the power storage system stops the operation (for example, charging and discharging) of its own system.

It should be noted that, the decision unit 13 may have the functions in the first to third example embodiments.

The monitoring unit 14 monitors whether an operation continuing time of the power storage system after identifying the type of the prohibited action does not exceed the operation continuable time, and outputs a stop command for stopping the operation of the power storage system in a case where the operation continuing time exceeds the operation continuable time. In accordance with the stop command, the power storage system stops the operation (for example, charging and discharging) of its own system. The measurement start timing of "operation continuing time of the power storage system after identifying the type of the prohibited action" is a design matter.

It should be noted that, the monitoring unit 14 may have the functions in the first and second example embodiments.

The application example of the monitoring system 10 of the present example embodiment is the same as the application example of the first example embodiment described with reference to FIGS. 9 to 11.

The monitoring system 10 of the present example embodiment described above can stop the operation of the power storage system after a certain period of time (operation continuable time) has elapsed, instead of stopping the operation of the power storage system suddenly in accordance with the detection. By properly setting the operation continuable time, it is possible to keep the benefits of both the user of the power storage system and the interested person who hates a decline in the value of the power storage system in good balance.

In case of the present example embodiment, the operation continuable time corresponding to a certain type of prohibited action can be set to "0". The operation of the power storage system can be stopped immediately after detection, by setting the operation continuable time "0". By taking the measures against the prohibition action that significantly lowers the value of the power storage system, the benefit of the interested person who hates a decline in the value of the power storage system can be sufficiently secured.

Fifth Example Embodiment

The monitoring system 10 of the present example embodiment has at least two of functions of the first to fourth example embodiments. According to the monitoring system 10 of the present example embodiment, advantageous effect similar to those of the first to fourth example embodiments can be realized.

The following are examples of reference aspects.

1. A monitoring system including:
a detection unit that detects that a detection value relating to a power storage system satisfies a condition;
an identification unit that identifies a type of fault occurring in the power storage system, in accordance with the detection by the detection unit; and
a decision unit that decides an operation continuable time of the power storage system after the type of fault is identified, on the basis of the type of fault.

2. The monitoring system according to 1, further including
a monitoring unit that monitors whether an operation continuing time of the power storage system after identifying the type of fault does not exceed the operation continuable time, and outputs a stop command for stopping the operation of the power storage system in a case where the operation continuing time exceeds the operation continuable time.

3. The monitoring system according to 1 or 2,
in which in a case where it is detected that the detection value satisfies a first condition, the detection unit notifies the identification unit of the fact, and
in which the identification unit identifies the type of fault occurring in the power storage system, in accordance with the detection that the first condition is satisfied.

4. The monitoring system according to 3,
in which the identification unit starts monitoring whether or not the detection value satisfies a stop condition in accordance with the detection that the first condition is satisfied, and outputs a stop command for stopping the operation of the power storage system, when the detection value satisfies the stop condition.

5. The monitoring system according to any one of 1 to 4,
in which in a case where it is detected that the detection value satisfies a second condition, the detection unit outputs a stop command for stopping the operation of the power storage system.

6. The monitoring system according to any one of 1 to 5,
in which the identification unit identifies that a ground fault occurs in the power storage system.

7. The monitoring system according to 6,
in which when one ground fault is identified, the decision unit decides the operation continuable time according to the type of fault.

8. The monitoring system according to 6 or 7,
in which in a case where "stop condition: occurrence of two or more ground faults" is satisfied, the identification unit outputs a stop command for stopping the operation of the power storage system.

9. The monitoring system according to any one of 1 to 8,
in which the monitoring system includes a plurality of apparatuses which are configured to communicate with each other, and
in which the identification unit identifies that a communication failure occurs in the power storage system.

10. The monitoring system according to 9,
in which the identification unit identifies that a communication failure occurs in the power storage system, in a case where a communication retry count during communication between the plurality of apparatuses exceeds a fourth reference value.

11. The monitoring system according to 9 or 10,
in which the decision unit decides the operation continuable time according to the type of fault, when a communication failure of the power storage system is identified.

12. The monitoring system according to any one of 1 to 11,
in which in a case where it is detected that the detection value satisfies a second condition, the detection unit outputs a stop command for stopping the operation of the power storage system, and
in which in a case where it is detected that the detection value satisfies the second condition indicating gas leakage from the power storage system, the detection unit outputs the stop command.

13. The monitoring system according to any one of 1 to 12, including:
a terminal device; and
a server,
in which the terminal device includes the detection unit,
in which the terminal device or the server includes the identification unit, and
in which the server includes the decision unit.

14. The monitoring system according to 13,
in which the terminal device or the server further includes
a monitoring unit that monitors whether an operation continuing time of the power storage system after identifying the type of fault does not exceed the operation continuable time, and outputs a stop command for stopping the operation of the power storage system in a case where the operation continuing time exceeds the operation continuable time.

15. The monitoring system according to 13 or 14,
in which the terminal device transmits a detection result obtained by the detection unit, to the server.

16. A server included in the monitoring system according to any one of 13 to 15.

17. A terminal device included in the monitoring system according to any one of 13 to 15.

18. A monitoring method executed by a computer, the method including:
a detection step of detecting that a detection value relating to a power storage system satisfies a condition;
an identification step of identifying a type of fault occurring in the power storage system, in accordance with the detection in the detection step; and
a decision step of deciding an operation continuable time of the power storage system after the type of fault is identified, on the basis of the type of fault.

19. A program causing a computer to function as:
a detection unit that detects that a detection value relating to a power storage system satisfies a condition;
an identification unit that identifies a type of fault occurring in the power storage system, in accordance with the detection by the detection unit; and
a decision unit that decides an operation continuable time of the power storage system after the type of fault is identified, on the basis of the type of fault.

This application claims priority based on Japanese Patent Application No. 2016-227621 filed on Nov. 24, 2016, and the disclosure of which is incorporated herein in its entirety.

The invention claimed is:

1. A power storage system comprising:
a system controller configured to control the power storage system;
a battery; and
a monitoring apparatus configured to output a stop command to the power storage system,
wherein the monitoring apparatus comprises:
at least one memory configured to store one or more instructions; and
at least one processor configured to execute the one or more instructions to:
detect that a detection value relating to the power storage system satisfies a condition;
identify a type of fault occurring in the power storage system, in accordance with the detection;
decide an operation continuable time of the power storage system after the type of fault is identified, on the basis of the type of fault;
monitor whether an operation continuing time of the power storage system after identifying the type of fault exceeds the operation continuable time;
output a stop command for stopping the operation of the power storage system in a case where the operation continuing time exceeds the operation continuable time; and
stop the monitoring in a case where an input showing execution of maintenance is accepted before the operation continuing time exceeds the operation continuable time,
wherein the at least one processor is configured to compute a life of the power storage system based on the identified type of fault.

2. The power storage system according to claim 1, wherein the processor is further configured to execute the one or more programs to:
in a case where it is detected that the detection value satisfies a first condition, notify the fact, and
identify a type of fault occurring in the power storage system, in accordance with the detection that the first condition is satisfied.

3. The power storage system according to claim 2, wherein the processor is further configured to execute the one or more programs to start monitoring whether or not the detection value satisfies a stop condition in accordance with the detection that the first condition is satisfied, and output a stop command for stopping the operation of the power storage system, when the detection value satisfies the stop condition.

4. The power storage system according to claim 1, wherein the processor is further configured to execute the one or more programs to, in a case where it is detected that the detection value satisfies a second condition, output a stop command for stopping the operation of the power storage system.

5. The power storage system according to claim 1, wherein the processor is further configured to execute the one or more programs to identify that a ground fault occurs in the power storage system.

6. The power storage system according to claim 5, wherein the processor is further configured to execute the one or more programs to, when one ground fault is identified, decide the operation continuable time according to the type of fault.

7. The power storage system according to claim 5, wherein the processor is further configured to execute the one or more programs to, in a case where "stop condition: occurrence of two or more ground faults" is satisfied, output a stop command for stopping the operation of the power storage system.

8. The power storage system according to claim 1, wherein the monitoring system comprises a plurality of apparatuses which are configured to communicate with each other, and
wherein the processor is further configured to execute the one or more programs to identify that a communication failure occurs in the power storage system.

9. The power storage system according to claim 8, wherein the processor is further configured to execute the one or more programs to identify that a communication failure occurs in the power storage system, in a case where a communication retry count during communication between the plurality of apparatuses exceeds a fourth reference value.

10. The power storage system according to claim 8, wherein the processor is further configured to execute the one or more programs to decide the operation continuable time according to the type of fault, when a communication failure of the power storage system is identified.

11. The power storage system according to claim 1, wherein the processor is further configured to execute the one or more programs to:
in a case where it is detected that the detection value satisfies a second condition, output a stop command for stopping the operation of the power storage system, and
in a case where it is detected that the detection value satisfies the second condition indicating gas leakage from the power storage system, output the stop command.

12. The power storage system according to claim 1, comprising:
a terminal device; and
a server,
wherein the terminal device comprises:
at least one memory configured to store one or more instructions; and
at least one processor configured to execute the one or more instructions, wherein the server comprises:
- at least one memory configured to store one or more instructions; and
- at least one processor configured to execute the one or more instructions, wherein the terminal device detects that a detection value relating to a power storage system satisfies a condition;

wherein the terminal device or the server identifies a type of fault occurring in the power storage system, in accordance with the detection;

wherein the server decides an operation continuable time of the power storage system after the type of fault is identified, on the basis of the type of fault.

13. The power storage system according to claim 12, wherein the terminal device or the server monitors whether an operation continuing time of the power storage system after identifying the type of fault does not exceed the operation continuable time, and outputs a stop command for stopping the operation of the power storage system in a case where the operation continuing time exceeds the operation continuable time.

14. The power storage system according to claim 12, wherein the terminal device transmits a detection result to the server.

15. A server included in the power storage system according to claim 13.

16. A terminal device included in the power storage system according to claim 13.

17. A monitoring method executed by a power storage system, the power storage system comprising:
- a system controller configured to control a power storage system;
- a battery; and
- a monitoring apparatus configured to output a stop command to the power storage system, the monitoring apparatus comprising at least one memory configured to store one or more instructions and at least one processor;

wherein the monitoring method comprises the processor executing the one or more instructions to:
- detect that a detection value relating to a power storage system satisfies a condition;
- identify a type of fault occurring in the power storage system, in accordance with the detection;
- decide an operation continuable time of the power storage system after the type of fault is identified, on the basis of the type of fault;
- monitor whether an operation continuing time of the power storage system after identifying the type of fault exceeds the operation continuable time;
- output a stop command for stopping the operation of the power storage system in a case where the operation continuing time exceeds the operation continuable time;
- stop the monitoring in a case where an input showing execution of maintenance is accepted before the operation continuing time exceeds the operation continuable time; and
- compute a life of the power storage system based on the identified type of fault.

18. A non-transitory storage medium storing a program causing a power storage system to:
- detect that a detection value relating to a power storage system satisfies a condition;
- identify a type of fault occurring in the power storage system, in accordance with the detection;
- decide an operation continuable time of the power storage system after the type of fault is identified, on the basis of the type of fault;
- monitor whether an operation continuing time of the power storage system after identifying the type of fault exceeds the operation continuable time;
- output a stop command for stopping the operation of the power storage system in a case where the operation continuing time exceeds the operation continuable time; and
- stop the monitoring in a case where an input showing execution of maintenance is accepted before the operation continuing time exceeds the operation continuable time;

wherein the program causes the computer to compute a life of the power storage system based on the identified type of fault; and wherein the power storage system comprises:
- a system controller configured to control a power storage system;
- a battery; and
- a monitoring apparatus configured to output a stop command to the power storage system.

* * * * *